(12) United States Patent
Bell et al.

(10) Patent No.: US 10,516,375 B2
(45) Date of Patent: Dec. 24, 2019

(54) SQUID-BASED TRAVELING WAVE PARAMETRIC AMPLIFIER

(71) Applicant: UNIVERSITY OF MASSACHUSETTS, Boston, MA (US)

(72) Inventors: Matthew Bell, Auburndale, MA (US); Ana Samolov, Quincy, MA (US)

(73) Assignee: University of Massachusetts, Boston, MA (US)

( * ) Notice: Subject to any disclaimer, the term of this patent is extended or adjusted under 35 U.S.C. 154(b) by 157 days.

(21) Appl. No.: 15/548,924

(22) PCT Filed: Feb. 5, 2016

(86) PCT No.: PCT/US2016/016697
§ 371 (c)(1),
(2) Date: Aug. 4, 2017

(87) PCT Pub. No.: WO2016/127021
PCT Pub. Date: Aug. 11, 2016

(65) Prior Publication Data
US 2018/0034425 A1 Feb. 1, 2018

Related U.S. Application Data (60) Provisional application No. 62/113,190, filed on Feb. 6, 2015.

(51) Int. Cl.
*H03F 19/00* (2006.01)
*H03F 7/04* (2006.01)

(52) U.S. Cl.
CPC ............... *H03F 19/00* (2013.01); *H03F 7/04* (2013.01)

(58) Field of Classification Search
CPC ... H03F 7/04; H03F 1/26; H03F 3/195; H03F 3/608; H03F 7/00; H01L 39/223; H01P 5/18
(Continued)

(56) References Cited

U.S. PATENT DOCUMENTS 3,943,383 A 3/1976 Hamel
6,331,805 B1 12/2001 Gupta et al.
(Continued)

FOREIGN PATENT DOCUMENTS

WO WO-2012123642 A1 * 9/2012 ......... G01R 33/0354

OTHER PUBLICATIONS

Muller et al., "Voltage-flux-characteristics of asymmetric dc SQUIDs", IEEE Transactions on Applied Superconductivity, vol. 10, pp. 1-5 (Year: 2001).*

(Continued)

*Primary Examiner* — Robert J Pascal
*Assistant Examiner* — Hafizur Rahman
(74) *Attorney, Agent, or Firm* — Brake Hughes Bellermann LLP (57) ABSTRACT

A traveling wave parametric amplifier involving a series of Josephson junctions is disclosed. Devices and systems incorporating traveling wave parametric amplifiers, and methods of using and fabricating traveling wave parametric amplifiers are also disclosed. In accordance with one or more aspects, traveling wave parametric amplifiers, devices and systems incorporating traveling wave parametric amplifiers, and methods of using and fabricating traveling wave parametric amplifiers are disclosed.

16 Claims, 8 Drawing Sheets

(58) Field of Classification Search
USPC .......................................................... 330/4.5
See application file for complete search history.

(56) References Cited

U.S. PATENT DOCUMENTS

| | | | |
|---|---|---|---|
| 9,948,254 B2* | 4/2018 | Narla | ...................... H03F 19/00 |
| 2005/0082519 A1 | 4/2005 | Amin et al. | |
| 2010/0033252 A1 | 2/2010 | Herr et al. | |
| 2010/0186512 A1 | 7/2010 | Goto et al. | |
| 2012/0098594 A1 | 4/2012 | Zmuidzinas et al. | |
| 2014/0314419 A1 | 10/2014 | Paik | |

OTHER PUBLICATIONS

Narla et al., "Wireless Josephson amplifier", Applied Physics Letters 104, 232605, published online on Jun. 12, 2014 (Year: 2014).*

Yaakobi et al., "Parametric amplification in Josephson junction embedded transmission lines", Physical Review B 87, 144301 (2013)) (Year: 2013).*

Hartridge et al., "Dispersive magnetometry with a quantum limited SQUID parametric amplifier", Physical Review B 83, 134501 (2011), pp. 1-8. (Year: 2011).*

Greenberg et al., "The Voltage-Current Characteristic of high TC DC SQUID: theory, simulation, experiment", Novosibirsk State Technical University, 20 K. Marx Ave., 630092 Novosibirsk, Russia, 2013, Retrieved on [Apr. 1, 2016]. Retrieved from internet <URL: http://arxiv.org/pdf/cond-maV0507537.pdf>.

Herrmann et al., "A Portable Dilution Refrigerator", Instruments and Experimental Techniques, vol. 48, No. 5, pp. 693-702, 2005, Retrieved on [Mar. 31, 2016]. Retrieved from internet <URL: http://ftp.kapitza.ras.ru/~edelman/PUB/IET693.pdf>.

Lake Shore Cryogenics, "Dilution Refrigerator Temperature Control", webpage company, 2015, Retrieved on [Apr. 1, 2016]. Retrieved from internet <URL: http://www.lakeshore.com/products/AC-Resistance-Bridges/Model-372/Pages/dilution-refrigerator-temperature-control.aspx>.

* cited by examiner

SQUID-BASED TRAVELING WAVE PARAMETRIC AMPLIFIER

CROSS-REFERENCE TO RELATED APPLICATION

This application claims priority under 35 U.S.C. § 119 to U.S. Provisional Patent Application Ser. No. 62/113,190, titled "TRAVELING WAVE PARAMETRIC AMPLIFIER," filed Feb. 6, 2015, which is incorporated herein by reference in its entirety for all purposes.

FIELD OF THE DISCLOSURE

The present disclosure is generally directed to amplifiers and more particularly to traveling wave parametric amplifiers, and methods of using and fabricating traveling wave parametric amplifiers.

BACKGROUND

Special amplifiers are used to amplify very weak signals. Quantum limited amplifiers (QLAs) are one such class of amplifiers. QLAs are finding uses in secure quantum communications, quantum cryptography, quantum computing, satellite based microwave communication systems, astrophysics research (such as dark matter searches or cosmic microwave background studies), and circuit-based quantum information processing. All of these applications involve sensing weak signals, for example, microwave signals, and require signal amplification in the presence of noise sources that may degrade or even destroy the information.

Preferably, a QLA would allow for operation over a wide frequency range, exhibit high gain, have a large dynamic range, and be compact and robust. However, it is difficult to achieve these characteristics simultaneously. Existing QLAs exhibit limited bandwidth, possess limited dynamic range, and require additional bulky microwave components that put physical design constraints on the above applications. For virtually all of the commercial applications discussed above, the bandwidth and the dynamic range of current state-of-the-art QLAs are not acceptable. Current QLA designs do not facilitate scalability and require far too much space in dilution refrigerators where they are most commonly used and where space comes at a significant cost.

Improvements in quantum information processing capabilities require overcoming a significant limiting technical obstacle: the parallel low-noise readout of quantum bits. Current technology is limited to the measurement of only a few quantum bits at a time due to the narrow bandwidth of current QLAs and the physical dimension of each measurement channel. A wide bandwidth quantum limited amplifier is necessary for the multiplexed readout of many quantum bits simultaneously.

Most of the applications for QLAs involve sensing weak signals near the single-photon level and require signal amplification in the presence of noise sources that may degrade or even destroy the information. Current amplification system technology suffers from several drawbacks making commercialization of the technology difficult.

First, operation of the amplifier at the quantum limit may involve cooling it in a dilution refrigerator to temperatures below 100 mK. To protect the amplifier and the device under test from noises in the system as well as thermal radiation from warmer stages in the dilution refrigerator, QLAs routinely include specialized cryogenic-grade circulators and isolators. Incorporation of circulators and isolators, which can be numerous, makes the system more complex.

Second, circulators and isolators are bulky components that greatly increase the size of the measurement system. The use of circulators and isolators also requires additional magnetic shielding and radio frequency (RF) cabling to room temperature, putting additional design constraints on the dilution refrigerator. The size, number, and complexity of the system with the required circulators, isolators, shielding, cabling, and refrigerator represent a significant cost. Ideally, a commercially viable QLA would obviate the need for a complex multi-component, bulky amplifier chain in these measurement setups.

Third, QLAs suffer from limited bandwidth, dynamic range, and signal gain. QLAs generally have internal noise levels smaller than the quantum mechanical fluctuations in the vacuum. This source of noise cannot be removed and represents the ultimate limit in the noise performance for any amplifier.

To address these limitations an ideal QLA would amplify in transmission mode, have a non-reciprocal gain, a large dynamic range, and no resonant structures to limit bandwidth.

U.S. Patent Application Publication No. 2012/0098594 discloses traveling wave parametric amplifier (TWPA) technologies based on superconducting NbTiN nanowires, which exploit the nonlinear kinetic inductance of the superconductor to parametrically amplify weak microwave signals. The main disadvantages of this amplifier are on-chip energy dissipation, operation above the quantum limit, elaborate microwave engineering requirements to inhibit generation of higher harmonics and suppress gain ripples, and difficult fabrication due to the high aspect ratio of a 1 μm×1 m long wire. The TWPA based on a superconducting nanowire has demonstrated a gain of 10 dB limited by the length and phase matching conditions of the signal, idler, and pump, which was insufficient to amplify the weak signal over the noise floor of a of the next amplifier in the measurement chain, typically a high electron mobility transistor amplifier (HEMT). Consequently, this type of amplifier is not suitable for most applications.

SUMMARY

In accordance with one or more aspects, traveling wave parametric amplifiers, devices and systems incorporating traveling wave parametric amplifiers, and methods of using and fabricating traveling wave parametric amplifiers are disclosed.

The disclosed traveling wave parametric amplifier (TWPA) addresses limitations inherent in existing QLAs. The disclosed TWPA is a two port device that amplifies a weak signal in transmission mode along the length of a microwave transmission line. The transmission line of the TWPA comprises of a chain of coupled asymmetric superconducting quantum interference devices (SQUIDs) which contributes a large tunable nonlinear inductance to the line. The nonlinearity of the transmission line allows for a mixing process to occur between a weak signal and a pump signal traveling along the transmission line, resulting in a parametric gain of the weak signal.

According to disclosed embodiments, amplification only occurs in the forward direction, and signals that travel in the reverse direction and oppose the pump tone—such as thermal noise—experience an amplification of less than or equal to unity. This feature of the amplifier is highly desirable since it eliminates the need for bulky cryogenic microwave components such as isolators and circulators that constitute a limiting factor for competing amplifier technologies.

Some advantages of the disclosed TWPAs include:

Non-reciprocal operation: The gain of a weak signal traveling in the forward direction through the TWPA with respect to the pump will be amplified, where signals that oppose the pump signal will experience an amplification of less than or equal to unity. This mode of operation of the TWPA performs the same function as the isolators found in current measurement setups where the isolators are generally placed between the HEMT and Josephson parametric amplifier (JPA). Instead, the proposed TWPA, with a large dynamic range and a nonreciprocal mode of operation, obviates the need for these isolators. As a result, even on-chip integration of the TWPA is possible.

Amplification in transmission: The proposed TWPA will amplify in transmission mode, eliminating the need for circulators normally placed between the device and JPA.

Dynamic Range: The chain of coupled asymmetric SQUIDs consists of large critical current Josephson junctions. Such junctions can conduct a large current resulting in a large dynamic range. This will allow for cascading of on-chip amplifiers, which can reduce the number of bulky microwave components in the readout chain.

Noise: Noise in the TWPA is minimized due to shorter transmission line lengths and lower losses.

Bandwidth: Since the proposed TWPA has no resonant structures, the achievable bandwidths can be on the order of 5 GHz, which allows for fast response times and multiplexed readout capabilities.

Footprint: Due to the large nonlinear inductance and the exponential gain dependence on TWPA length, the length of the transmission line can be made significantly short and achieve high gain.

Extensive numerical simulations of the response of the TWPA to a pump and weak signal have confirmed exponential gain of the weak signal versus length over a wide bandwidth in signal frequency. Design parameters of the nonlinear transmission line, such as capacitance per unit length and junction parameters, have been determined from these numerical simulations. The proposed TWPA has also been designed to allow for tunability of the amplifier performance with an external magnetic field to allow for in situ optimization of the TWPA. Tunability in turn provides for relaxed tolerances of design parameters during device fabrication.

The disclosed TWPA is ideally suited for low noise amplification over a wide bandwidth and large dynamic range. The amplifier is compact, robust, and well suited for ultra-secure quantum communication applications (used in quantum repeaters for long distance secure data transmission), quantum key distribution, quantum information applications (quantum bit readout electronics), long distance communications, and mixed signal applications.

In accordance with an aspect of the present disclosure, there is provided a traveling wave parametric amplifier. The traveling wave parametric amplifier comprises a first port configured to receive a weak signal and a pump signal and a transmission line in communication with the first port and configured to transmit the weak signal and the pump signal. The transmission line comprises a plurality of coupled asymmetric SQUIDs configured to amplify the weak signal to provide an amplified signal. The traveling wave parametric amplifier further comprises a second port from which the amplified signal exits.

In some embodiments, each of the plurality of coupled asymmetric SQUIDs comprises a plurality of Josephson junctions. The plurality of coupled asymmetric SQUIDs may define a ladder-like structure. Each of the plurality of coupled asymmetric SQUIDs may comprise at least one of a smaller Josephson energy junction, and more than one of a larger Josephson energy junction, wherein the larger Josephson energy junction has a higher critical current than the smaller Josephson energy junction. Each of the plurality of coupled asymmetric SQUIDs may comprise one smaller Josephson energy junction, and two to three larger Josephson energy junctions. Adjacent coupled asymmetric SQUIDs may be coupled through a larger Josephson energy junction. The larger Josephson energy junctions of adjacent coupled asymmetric SQUIDs may form a serpentine path.

In some embodiments, the in-plane dimensions of both the small and large Josephson junctions do not exceed $0.3 \times 0.3$ μm$^2$.

In some embodiments, each of the larger Josephson energy junctions has a Josephson energy in the range 10 to 20 Kelvin and a charging energy in the range 0.1 to 0.2 Kelvin. By adjusting the ratio of the Josephson energy of the large junction to that of the small junction, the inductance and its non-linearity can be tuned.

In some embodiments, the critical current of the smaller Josephson energy junctions is in the range 0.5 μA to 2 μA. The critical current of the larger Josephson energy junctions may be in the range 2 μA to 8 μA.

In some embodiments, by adjusting the magnetic flux in situ tuning of the inductance and its non-linearity can be utilized to realize phase matching conditions in a degenerate four-wave mixing process.

In some embodiments, the chain of coupled asymmetric SQUIDs is configured to allow for a mixing process to occur between a weak signal, generated idler and the pump signal traveling along the transmission line, resulting in a parametric gain of the weak signal.

In some embodiments, the amplifier is further configured to amplify only in a forward direction.

In some embodiments, the amplifier is further configured to amplify in a transmission mode.

In some embodiments, the amplifier is further configured to provide an exponential gain of the weak signal as a function of device length.

In some embodiments, the amplifier comprises no resonators.

In some embodiments, the amplifier is further configured to have a bandwidth of about 1 GHz to about 6 GHz.

In some embodiments, the amplifier is further configured to have a gain of 20 dB or greater.

In some embodiments, the amplifier is further configured to have a saturation power of −95 dBm or greater.

In some embodiments, a power of the weak signal is between −150 dBm and −95 dBm. A power of the pump signal may be between −75 dBm and −65 dBm.

In some embodiments, the transmission line has an overall path length of between about 1 mm and 6 mm.

In accordance with another aspect, there is provided a system for amplifying a quantum signal. The system comprises a device under test emitting a weak signal, a pump device emitting a pump signal and a traveling wave parametric amplifier configured to receive the weak signal and the pump signal and to amplify the weak signal to provide an amplified signal. The traveling wave parametric amplifier comprises a first port configured to receive a weak signal and a pump signal and a transmission line in communication with the first port and configured to transmit the weak signal and the pump signal. The transmission line comprises a plurality of coupled asymmetric SQUIDs configured to amplify the weak signal to provide an amplified signal. The traveling wave parametric amplifier further comprises a second port from which the amplified signal exits.

In some embodiments, the system further comprises a dilution refrigerator in which the traveling wave parametric amplifier is positioned. The dilution refrigerator may comprise a first zone and a second zone. The first zone may be maintained at a lower temperature than the second zone. The traveling wave parametric amplifier may be positioned in the first zone of the dilution refrigerator. The system may further comprise a single isolator positioned in the second zone of the dilution refrigerator. The system may include no circulators.

In accordance with another aspect, there is provided an integrated circuit comprising a traveling wave parametric amplifier. The traveling wave parametric amplifier comprises a first port configured to receive a weak signal and a pump signal and a transmission line in communication with the first port and configured to transmit the weak signal and the pump signal. The transmission line comprises a plurality of coupled asymmetric SQUIDs configured to amplify the weak signal to provide an amplified signal. The traveling wave parametric amplifier further comprises a second port from which the amplified signal exits.

In some embodiments, the integrated circuit further comprises a device under test. The integrated circuit may have a length of about 5 mm or less and a width of about 5 mm or less.

In accordance with another aspect, there is provided a method of amplification. The method comprises providing a transmission line incorporating a plurality of coupled asymmetric SQUIDs, tuning the plurality of coupled asymmetric SQUIDs with an external magnetic field, producing a weak signal, producing a pump signal, coupling the weak signal and the pump signal to produce a coupled signal, and transmitting the coupled signal through the plurality of coupled asymmetric SQUIDs to produce an amplified signal.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The proposed TWPA utilizes the tunable nonlinearity of a one dimensional chain of asymmetric dc-SQUIDs with nearest neighbor coupling through mutually shared Josephson junctions as a transmission line to overcome phase matching limitations. A magnetic flux 1 threads each dc-SQUID to allow for tunability of the linear and nonlinear properties of the transmission line. A weak signal to be amplified and a strong pump tone will be incident on the input port of the transmission line. Due to the nonlinearity of the transmission line the weak signal will undergo parametric amplification through a degenerate four-wave mixing (FWM) process. The amplification process is the most efficient when the total phase mismatch is close to zero. However, due to the nonlinearity of the transmission line a strong pump modifies phase matching through self and cross phase modulation resulting in a phase mismatch. The linear dispersion of the transmission line along with spectral separation of the signal and pump angular frequencies can be used to compensate for the nonlinear phase mismatch. The unique feature of the proposed TWPA is that the nonlinear coupling and linear dispersion can be tuned with 1, and the nonlinear coupling can even change sign. By adjusting 1 for a given pump power, phase matching can be achieved.

Figure 1A:
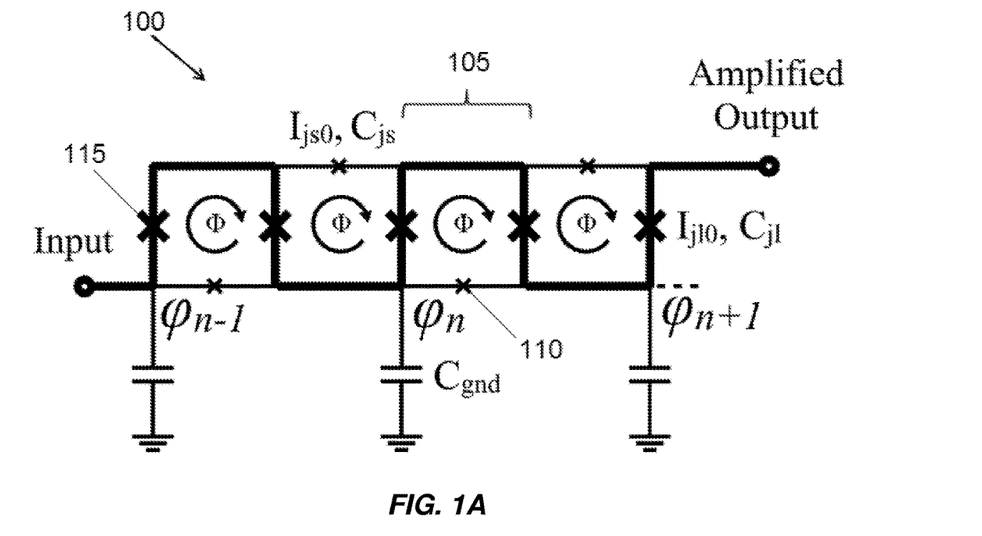
FIG. 1A is a circuit schematic of a TWPA including a transmission line composed of a one dimensional chain of coupled asymmetric SQUIDs.
Figure 1B:
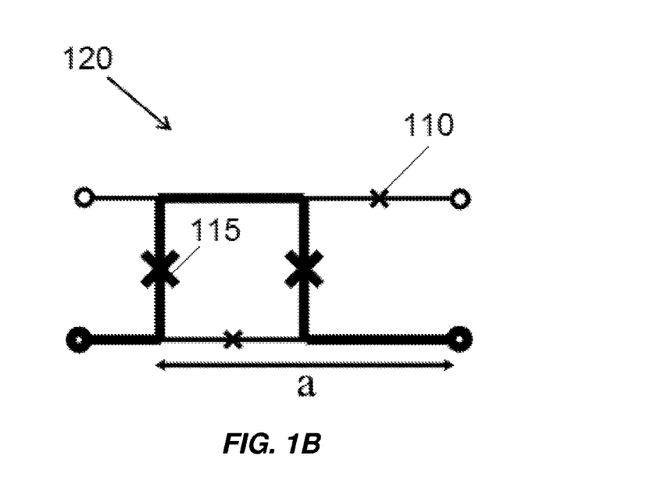
FIG. 1B is a circuit schematic of a unit cell of the TWPA of FIG. 1A.

The circuit design for an embodiment of the proposed TWPA is shown in FIG. 1A, indicated generally at 100. The disclosed TWPA includes a transmission line composed of a one dimensional chain of coupled asymmetric SQUIDs 105. Each cell of the transmission line is an asymmetric dc-SQUID 105 with a single "small" Josephson junction 110 with critical current $I_{js0}$ and capacitance $C_{js}$ in one arm and two "large" Josephson junctions 115 with critical current $I_{jl0}$ and capacitance $C_{jl}$ in the other arm. Adjacent cells to one another are coupled via the large Josephson junctions 115. A magnetic flux $\Phi$ threads each SQUID 105. A feature of this arrangement is that for an even number of asymmetrical dc-SQUIDs in the chain the Josephson energy $E_j(\phi)$ remains an even function of the phase difference $\phi$ across the chain. The proposed TWPA 100 includes a long transmission line with many unit cells. This allows boundary effects to be largely neglected in favor of focusing on translationally invariant solutions. At arbitrary Φ the transmission line remains symmetric under the translation by two cells. The defined unit cell 120 of the transmission line is composed of two large and two small Josephson junctions 115, 110 (FIG. 1B). Each unit cell 120 is of length a and has a capacitance to ground of $C_{gnd}$. The "backbone" of the unit cell 120 is made up of large Josephson junctions (highlighted in bold in FIGS. 1A and 1B), which are designed to have Josephson energies two orders of magnitude larger than the charging energy of the junction allowing the effect of quantum fluctuations to be neglected and to utilize a classical description of the system.

The phases on the two large junctions 115 for each unit cell are α and α', and the total phase across the unit cell 120 is φ=α=α'. A gauge was chosen such that an external magnetic field would induce phases $2\pi\Phi/\Phi_0$ on smaller junctions, where $\Phi_0$ is the flux quantum. The approximation of the current phase relation of the unit cell is:

$$I(\varphi) = I_{js0}\left[\frac{r}{2} + 2\cos\left(2\pi\frac{\Phi}{\Phi_0}\right)\right]\varphi - I_{js0}\left[\frac{r}{48} + \frac{1}{2}\cos\left(2\pi\frac{\Phi}{\Phi_0}\right)\right]\varphi^3 \quad (1)$$

Figure 2A:
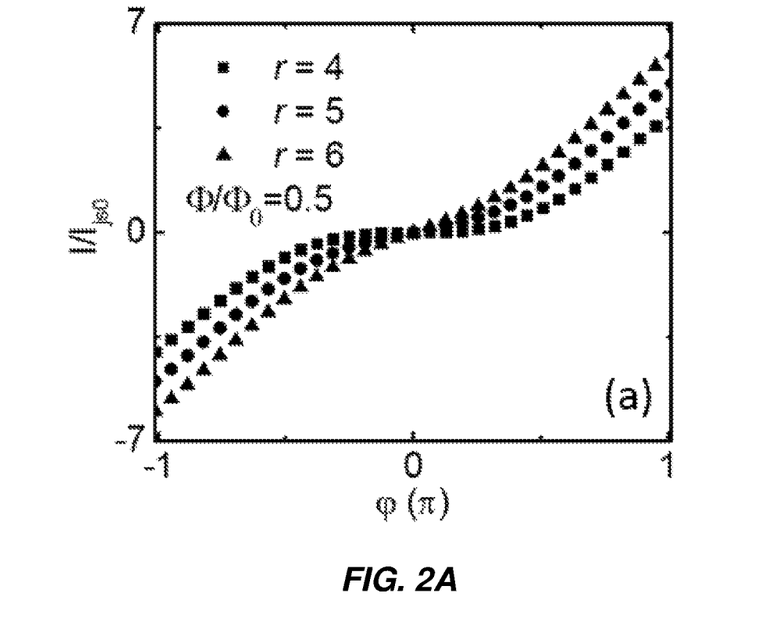
FIG. 2A is a chart of the current-phase relation of a unit cell of the TWPA for various ratios of $r=I_{j10}/I_{js0}$.
Figure 2B:
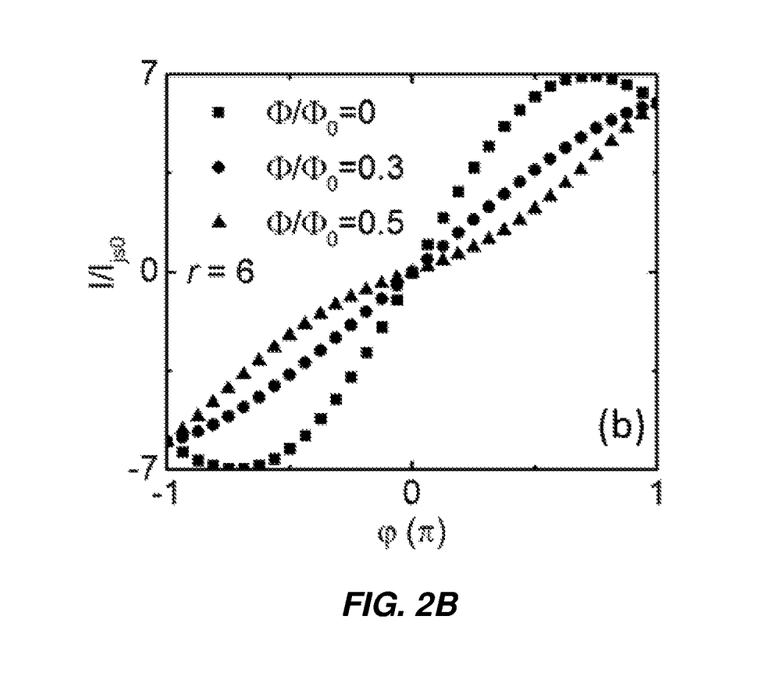
FIG. 2B is a chart of the current-phase relation of a unit cell of the TWPA for various ratios of $\Phi/\Phi_0$.

FIGS. 2A and 2B show the current-phase relation of a unit cell of the TWPA for various $r=I_{jl0}/I_{js0}$ and Φ. FIG. 2A and equation (1) show that the nonlinearity at I(φ≈0) is always positive at full frustration $\Phi/\Phi_0=0.5$ for r<16. FIG. 2B and Eq. (1) show that for certain r values (example r=6) by adjusting Φ the nonlinearity can be tuned over a wide range, and can even change sign from negative to positive. By tuning the nonlinearity it is possible to optimize the parametric amplification efficiency of the FWM process.

In this disclosure we are assuming a sufficiently long wavelength λ of a wave-type excitation traveling along the TWPA $$\left(\frac{\alpha}{\lambda} \ll 1\right),$$

we can use the continuum approximation and replace the discreteness of the transmission line by a continuous position z along the transmission line. The following nonlinear wave equation for the TWPA is derived:

$$\frac{a^2}{L}\left[\frac{r}{2} + 2\cos\left(2\pi\frac{\Phi}{\Phi_0}\right)\right]\frac{\partial^2 \varphi}{\partial z^2} + \quad (2)$$
$$a^2 C_{js}\left(\frac{r}{2} + 2\right)\frac{\partial^4 \varphi}{\partial t^2 \partial z^2} - C_{gnd}\frac{\partial^2 \varphi}{\partial t^2} - \gamma \frac{\partial}{\partial z}\left[\left(\frac{\partial \varphi}{\partial z}\right)^3\right] = 0,$$

where $L=\varphi_0/I_{js}$ and $\varphi_0=\Phi_0/(2\pi)$. The first three terms of the wave equation represents the linear contributions to the dispersion on the transmission line due to the distributed inductances and capacitances and how they can be tuned with r and Φ. The fourth term describes the nonlinearity and how the nonlinear coupling coefficient, $\gamma=a^4/(\varphi_0^2 L)(r/48+\frac{1}{3}\cos(2\pi\Phi/\Phi_0))$ can be tuned with Φ.

The solution to Eq. (2) is assumed to be a superposition of a pump, signal, and idler waves propagating along the transmission line of the form $$\varphi(z,t) = \frac{1}{2}[A_p(z)e^{i(k_p z - \omega_p t)} + A_s(z)e^{i(k_s z - \omega_s t)} + A_i(z)e^{i(k_i z - \omega_i t)} + c.c.], \quad (3)$$

where c.c. denotes complex conjugate, $A_m$ is the complex amplitudes, $k_m$ is the wave vectors, and $\omega_m$ is the angular frequencies of the pump, signal, and idler (m={p, s, i}). A degenerate four wave mixing process is considered under the following frequency matching condition $\omega_s+\omega_i=2\omega_p$. Eq. (3) is substituted into Eq. (2) and assuming a slowly varying envelope of the propagating waves where $|\partial^2 A_m/\partial z^2| \ll |k_m \partial A_m/\partial z|$ and $|\partial A_m/\partial z| \ll |k_m A_m|$, a uniform transmission line where $C_{gnd}$, $C_{js}$ and $k_m$ are constant, a set of coupled equations which describes the propagation of the pump, signal, and idler waves along the transmission line is determined:

$$\frac{\partial A_p}{\partial z} - i\Phi_p A_p = 0, \quad (4)$$

$$\frac{\partial A_s}{\partial z} - i\Phi_s A_s - \frac{i3\gamma k_p^2 k_s (2k_p - k_i) A_i^* A_p^2}{8 \cdot \omega_s^2 C_{gnd}} e^{-i\Delta k z} = 0, \quad (5)$$

$$\frac{\partial A_i}{\partial z} - i\Phi_i A_i - \frac{i3\gamma k_p^2 k_i (2k_p - k_s) A_s^* A_p^2}{8 \cdot \omega_i^2 C_{gnd}} e^{-i\Delta k z} = 0, \quad (6)$$

where a large pump amplitude relative to the signal and idler amplitudes was assumed and the quadratic terms in $A_{s,i}$ were neglected, $\Delta k=k_s+k_i-2k_p$ is the phase mismatch due to linear dispersion, and $\Phi_m$ is the self-phase modulation per unit length a:

$$\Phi_s = \frac{3\gamma k_p^s k_p^3 |A_{ps}|^2}{4 C_{gnd}\omega_s^2}, \quad (7)$$

$$\Phi_i = \frac{3\gamma k_i^s k_i^2 |A_{po}|^2}{4 C_{gnd}\omega_i^2},$$

$$\Phi_p = \frac{3\gamma k_p^s |A_{po}|^2}{8 C_{gnd}\omega_p^2},$$

where $|A_{po}|$ is the initial pump amplitude. The linear dispersion relation for this transmission line is $$k_m = \frac{\omega_m \sqrt{LC_{gnd}}}{a\sqrt{\left[\frac{r}{2} + 2\cos\left(2\pi\frac{\Phi}{\Phi_0}\right)\right] - \omega_m^2 LC_{js}\left(\frac{r}{s}+2\right)}}. \quad (8)$$

Assuming an un-depleted pump amplitude and the following substitutions $A_p(z)=A_{p0}e^{i\Phi_p z}$ solution to Eq. (4), $A_s(z)=a_s(s)e^{i\Phi_s z}$, and $A_i(z)=a_i(z)e^{i\Phi_i z}$ into (5) and (6) to obtain:

$$\frac{\partial a_s}{\partial z} - \frac{i3\gamma k_p^s k_i k_s (2k_p - k_i) a_i^* |A_{po}|^2}{8\omega_s^2 C_{gnd}} e^{i\kappa z} = 0, \quad (9)$$

$$\frac{\partial a_i}{\partial z} - \frac{i3\gamma k_p^2 k_s k_i (2k_p - k_s) a_s^* |A_{po}|^2}{8\omega_i^2 C_{gnd}} e^{i\kappa s} = 0, \quad (10)$$

where $\kappa=-\Delta k+2\Phi_p-\Phi_s-\Phi_i$ is the total phase mismatch. Equations (9) and (10)) are similar to well established fiber parametric amplifier theory and have the following solution to describe the amplitude of the signal along the length of the transmission line assuming zero initial idler amplitude:

$$a_s(z) = a_{s0}\left[\cosh(gz) - \frac{i\kappa}{2g}\sinh(gz)\right]e^{i\kappa z/2}. \quad (11)$$

A similar solution to (11) exists for the idler amplitude. The exponential gain factor is $$g = \sqrt{\left(\frac{k_s^2 k_i^2(2k_p-k_z)(2k_p-k_i)\omega_p^4}{k_p^s\omega_i^2\omega_s^2}\right)\Phi_p^2 - \left(\frac{\kappa}{2}\right)^2}. \quad (12)$$

The signal power gain can be determined from Eq. (11)

$$G_s = \left|\cosh(gz) - \frac{i\kappa}{2g}\sinh(gz)\right|^2. \quad (13)$$

Figure 3:
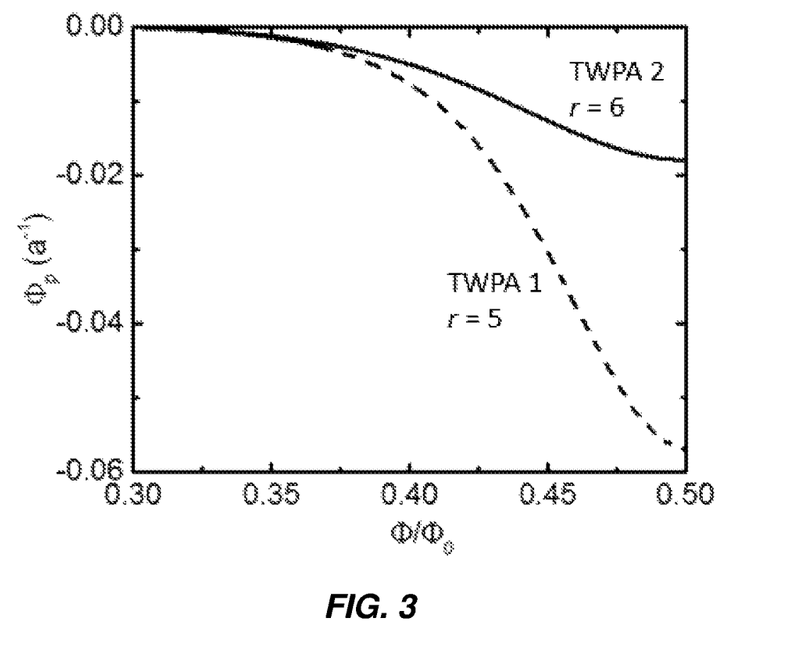
FIG. 3 is a chart illustrating pump self-phase modulation per unit length as a function of magnetic flux $\Phi/\Phi_0$ for an embodiment of the disclosed TWPA.

From this point forward, numerical results are presented for a realizable set of parameters for the disclosed TWPA. For each unit cell, we use the values shown in Table 1. Two different sets of parameters were used in simulating the proposed TWPA. The main difference between the two sets of parameters was the r values. The simulated TWPA 1 parameters results in a larger nonlinearity as shown by the pump self-phase modulation $\Phi_p\partial\gamma k_p^s|A_{p0}|^2$ of the transmission line shown in FIG. 3 which is desirable for high gains over short lengths of transmission line. The simulated TWPA 2 parameters tolerate a larger spread in Josephson junction parameters, however at the cost of reduced nonlinearity of the transmission line shown in FIG. 3 (black line). All of the simulations in this disclosure unless otherwise noted will utilize the TWPA 2 parameters since this design will be able to accommodate the tolerance in parameters of most Josephson junction fabrication process.

In choosing $C_{gnd}$ and the inductance of the large junctions $L_{jl}=\Phi_0/(rI_{js0})$ which ultimately sets the characteristic impedance of the transmission line, special attention was made to achieve an impedance of 50Ω to maintain compatibility with commercial electronics. A realizable unit cell size is a=10 μm. The simulated pump tone frequency was in the range 6-9 GHz, and the power was typically −72 dBm which is equivalent to $I_{prms}\approx 1$ μA, the signal angular frequency $\omega_s$ was varied in most cases and the idler angular frequency is $\omega_i=2\omega_p-\omega_s$ with initial signal and idler power levels 80 dB and 160 dB lower than the pump power, respectively.

TABLE 1

Some Realizable Parameters for the TWPA.

| Parameter | TWPA 1 | TWPA 2 |
|---|---|---|
| R | 5 | 6 |
| $C_{gnd}$ | 50 fF | 50 fF |
| $C_{js}$ | 50 fF | 50 fF |
| $C_{jl}$ | $rC_{js}$ | $rC_{js}$ |
| $I_{js0}$ | 1 μA | 1 μA |
| $I_{jl0}$ | $rI_{js0}$ | $rI_{js0}$ |

Figure 4:
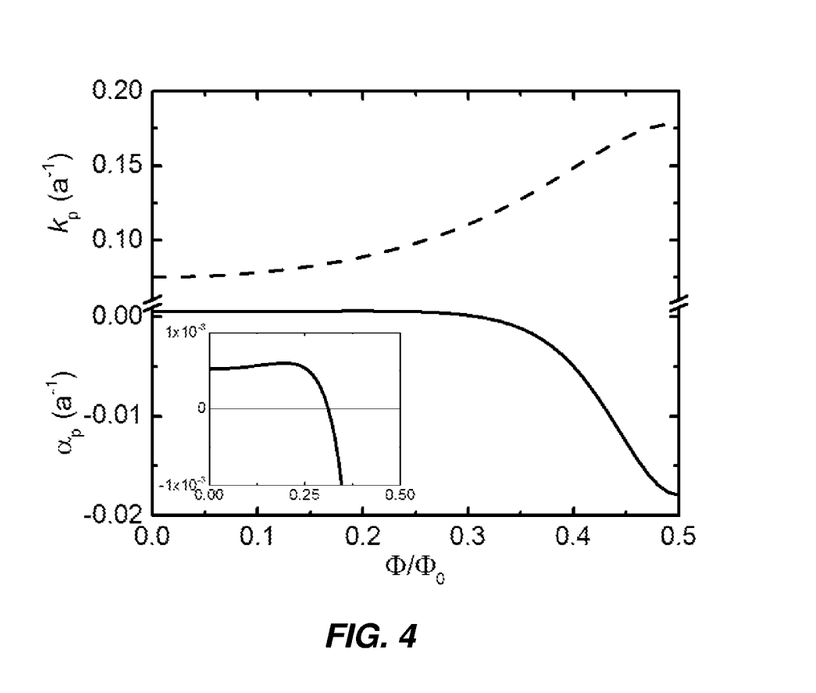
FIG. 4 is a chart illustrating pump tone wave vector (dashed line) and pump self-phase modulation per unit length (solid line) as a function of magnetic flux $\Phi/\Phi_0$ for an embodiment of the disclosed TWPA.

Shown in FIG. 4 is the dependence of $k_p$ and $\Phi_p$ on $\Phi/\Phi_0$. The inset in FIG. 4 shows the change in sign of $\Phi_p$ versus $\Phi/\Phi_0$.

From the inset in FIG. 4 it can be seen that γ and as a result $\Phi_p$ changes sign from positive to negative for $\Phi>0.31\Phi_0$ and more importantly is of opposite sign to $\Delta k\geq 0$ for this transmission line. By adjusting Φ and at a particular $\omega_p$ and $\omega_s$ it is possible to utilize Δk which increases with Φ in the transmission line to compensate the effects of self-phase modulation due to large pump powers.

Figure 5:
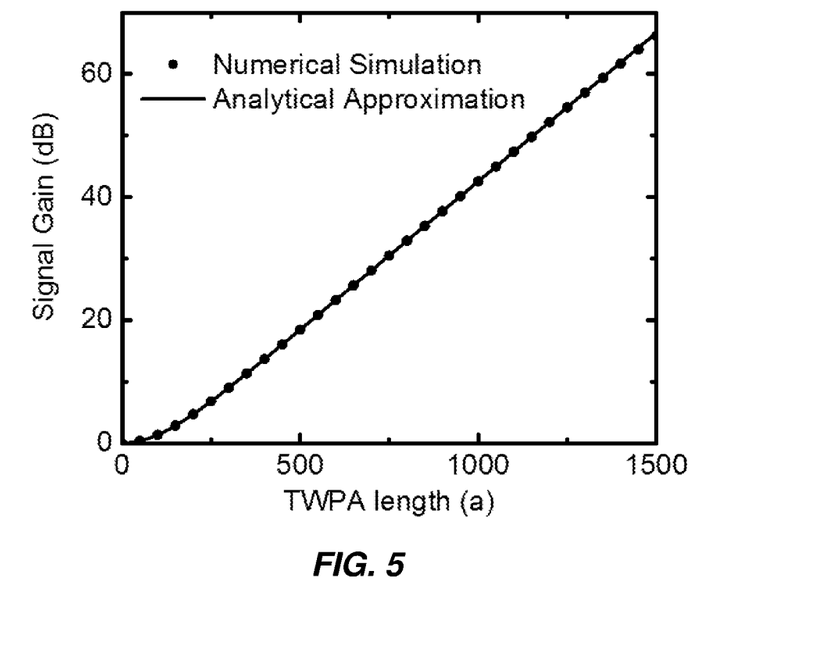
FIG. 5 is a chart illustrating the results of numerical simulation of the forward-direction amplification of a weak signal co-propagating with a strong pump along the length of the transmission line of an embodiment of the disclosed TWPA.

Shown in FIG. 5 is the results of numerical simulation of the forward-direction amplification of a weak signal co-propagating with a strong pump along the length of the transmission line. This simulation with the optimal tuning parameters: $\omega_p/2\pi=6.5$ GHz at a power level of −72 dBm, $\omega_s/2\pi=9.1$ GHz, and $\Phi/\Phi_0=0.45$ achieves near phase matching conditions $\kappa\approx 0$, where the exponential gain factor g is the largest and real and the signal gain has an exponential dependence on the length of the transmission line of the TWPA $G_s=|e^{gx}/2|^2$ as shown. Since the signal power was 80 dB less than the pump power in the simulations the analytical result assuming an undepleted pump (FIG. 5 solid line) agrees well with the numerical simulations. As shown a 20 dB gain can be readily achieved at a transmission line length of 600a (6 mm) and a 70 dB gain can be achieved at a transmission line length of 1500a (15 mm). However with such large gains >50 dB and wide bandwidths the amplifier may be saturated from vacuum photons.

Figure 6:
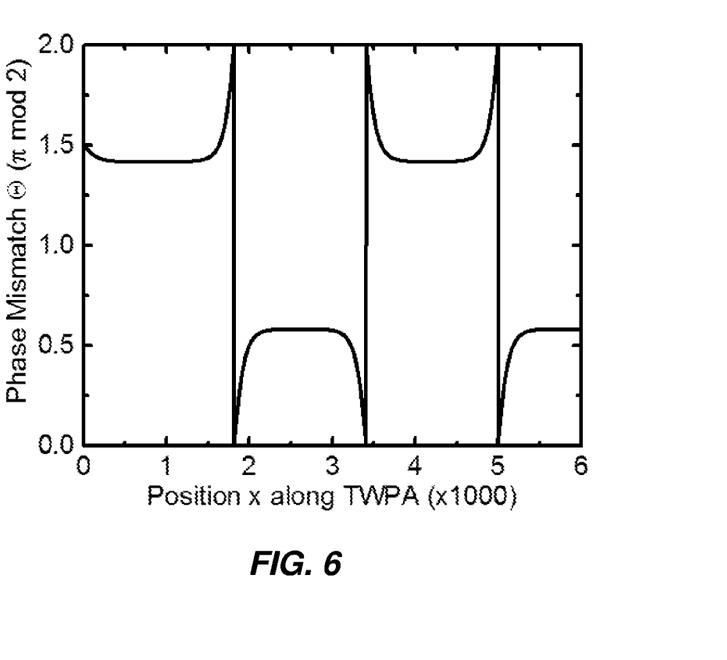
FIG. 6 is a chart illustrating simulated total phase mismatch at a position x along the transmission line of an embodiment of the disclosed TWPA with the same optimal tuning parameters as in FIG. 5.
Figure 7:
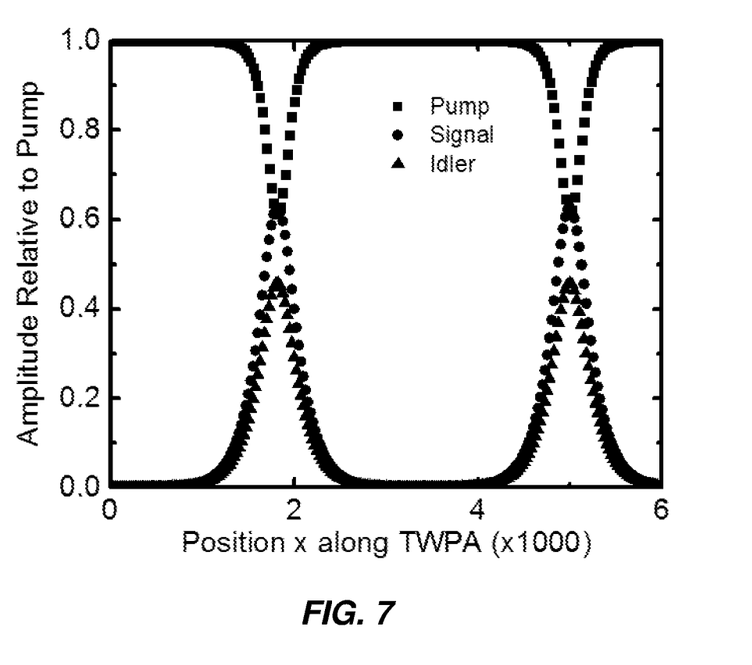
FIG. 7 is a chart illustrating spatial evolution of the signal, idler, and pump amplitudes at unit cell position x along the TWPA transmission line.

The exponential dependence of the gain on the length of the TWPA is the result of energy transfer from the pump to the signal and idler. This energy transfer is governed by the total phase mismatch along the length of the transmission line which makes up the TWPA. Shown in FIG. 6 is the simulated total phase mismatch at a position x along the transmission line with the same optimal tuning parameters as in FIG. 5. Since phase matching conditions are met with the optimal tuning parameters over the range x=200-1500 the phase does not change appreciably from 1.4π. As the transmission line is made longer the signal, idler, and even amplitude noise from vacuum photons gets larger as it experiences more gain and becomes comparable to the pump amplitude. When this happens the pump gets depleted and the gain of the amplifier diminishes. This effect is shown in FIG. 7 where the relative amplitude of the signal, idler, and pump normalized to the initial pump amplitude is simulated under the same conditions shown in FIG. 5. At unit cell position x=1500 the pump amplitude begins to drop significantly due to pump depletion effects. Under these conditions the assumption of an un-depleted pump is no longer valid and the analytical approximation is invalid. As a result of the pump becoming depleted the phase matching condition is altered and a phase difference can begin to accumulate over the range x=1500-2100 and flips by nearly π. For x=2100-3100 the total phase mismatch is 0.6π where the energy transfer is reversed, now transferring energy from the signal and idler to the pump, and phase matching is again restored as the signal and idler amplitude become appreciably small versus length of the TWPA (FIG. 6, x=1800-3100) in comparison with the pump amplitude. The switching of energy transfer direction from the pump to signal and idler is a periodic process over the length of the TWPA. This entire analysis was done with an initial signal, idler, and pump power of −152 dBm, −232 dBm, and −72 dBm, respectively. For different signal, idler, and pump powers depletion effects can be vastly different.

Figure 8A:
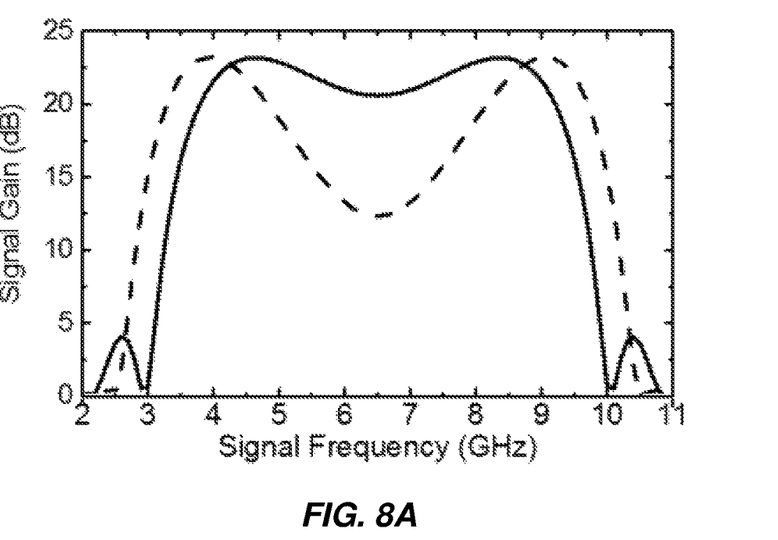
FIG. 8A is a chart illustrating calculated signal gain of an embodiment of the disclosed TWPA as a function of frequency.
Figure 8B:
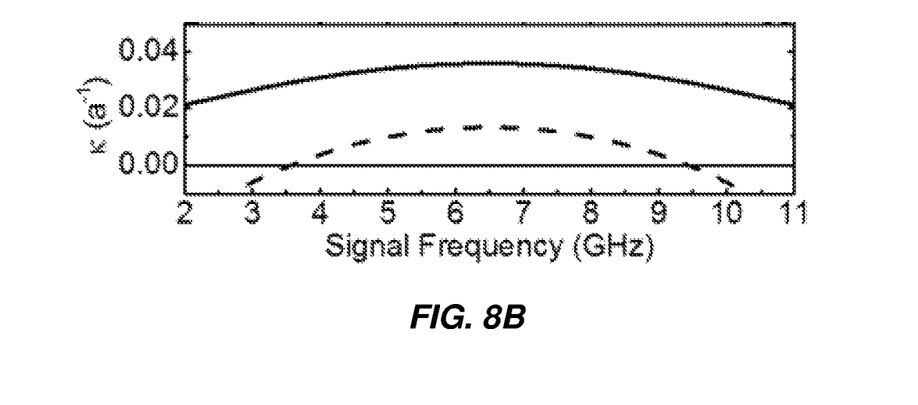
FIG. 8B is a chart illustrating calculated phase mismatch of an embodiment of the disclosed TWPA as a function of frequency.
Figure 8C:
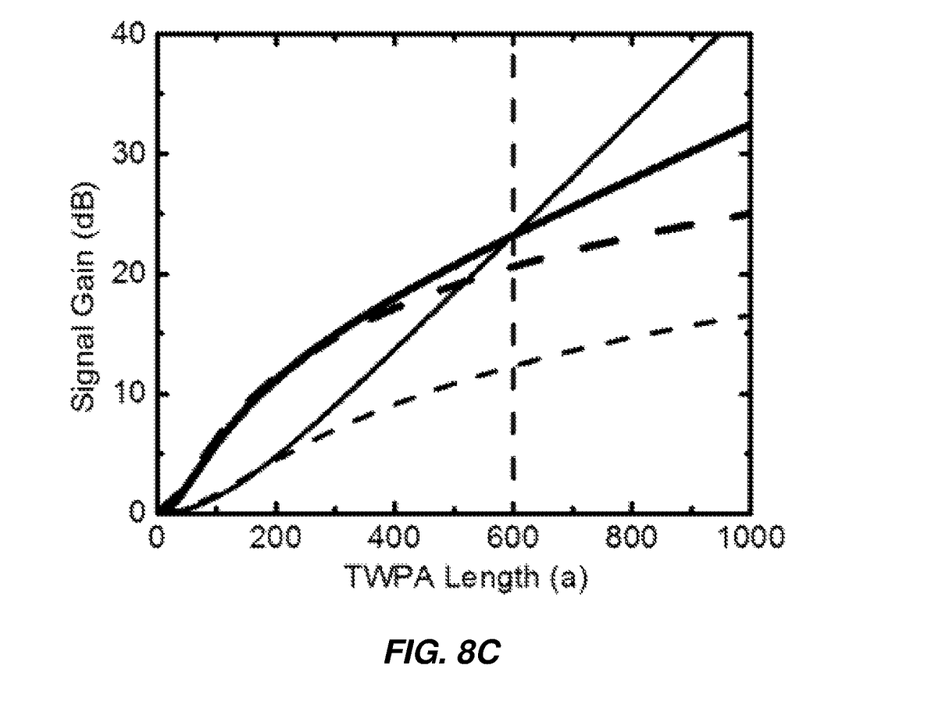
FIG. 8C is a chart illustrating calculated dependence of signal gain of an embodiment of the disclosed TWPA as a function of transmission line length.

Shown in FIG. 8A is numerical simulations of the signal gain as a function of signal frequency for the proposed TWPA with a transmission line length of 600a. For a magnetic flux tuning of $\Phi/\Phi_0=0.45$ and pump power −72 dBm, FIG. 8A (dashed line) there are two regions $\omega_s/2\pi=3.5$ and 9.5 GHz where perfect phase matching $\kappa=0$ can be achieved, and for comparison the phase mismatch dependence on signal frequency is shown in FIG. 8B (dashed line). For $\kappa\approx0$, near at $\omega_s/2\pi=3.9$ and 9.1 GHz, g is real and positive, the gain depends exponentially on the TWPA length. See FIG. 8C (thin solid line). At these two regions, quasi-exponential gain can be realized over a 1.5 GHz, 3 dB bandwidth. A major advantage of this tuning configuration is that the pump frequency $\omega_p/2\pi=6.5$ GHz does not lie within the regions of exponential gain and thus does not need to be isolated from the incoming weak signal from the device under test. When the phase mismatch $\kappa$ is the largest at $\omega_s/2\pi=6.5$, g is small and the gain depends quadratically on the length of the TWPA as shown in FIG. 8C (thin dashed line). Due to regions of exponential gain and quadratic gain depending on signal frequency the 3 dB bandwidth of the TWPA 1.5 GHz is limited to two regions where $\kappa\approx0$ centered at $\omega_s/2\pi=3.9$ an 9.1 GHz.

In FIGS. 8A and 8B the dashed lines and solid lines represent flux tunings (pump power) of $\Phi/\Phi_0=0.45$ (−72 dBm) and $\Phi/\Phi_0=0.5$ (−70 dBm), respectively. In FIG. 8C thin and thick solid lines correspond to $\omega_s/2\pi=9.1$ GHz and 8.4 GHz respectively. Dashed thin and thick lines correspond to $\omega_s/2\pi=6.5$ GHz. As can be seen the region of exponential gain is $\kappa\approx0$. According to the dependence for g the most optimal gain does not necessarily occur at perfect phase matching $\kappa=0$ due to the pre-factor to $\Phi_p^2$. At significant $\kappa$ the gain depends quadratically on the length shown in FIG. 8C dashed lines and thick solid line. For the flux tuning of $\Phi/\Phi_0=0.5$, exponential gain is impossible at all frequencies.

To achieve a wide 3 dB bandwidth a magnetic flux tuning of $\Phi/\Phi_0=0.5$ and pump power −70 dBm will cause $\kappa$ to be large (FIG. 8B, dashed line) over the entire range of signal frequencies simulated and only a quadratic gain dependence is possible over that same range. Since the nonlinearity of this transmission line is large in comparison to competing Josephson based TWPA designs, significant gain >32 dB is still possible without phase matching in this region. Since the signal gain increases quadratically for all frequencies a relatively flat gain characteristic of the amplifier can be achieved with a signal gain of 23 dB over a 3 dB bandwidth greater than 5.4 GHz. The vertical dashed line in FIG. 8C represents a device length of 600a.

Figure 9:
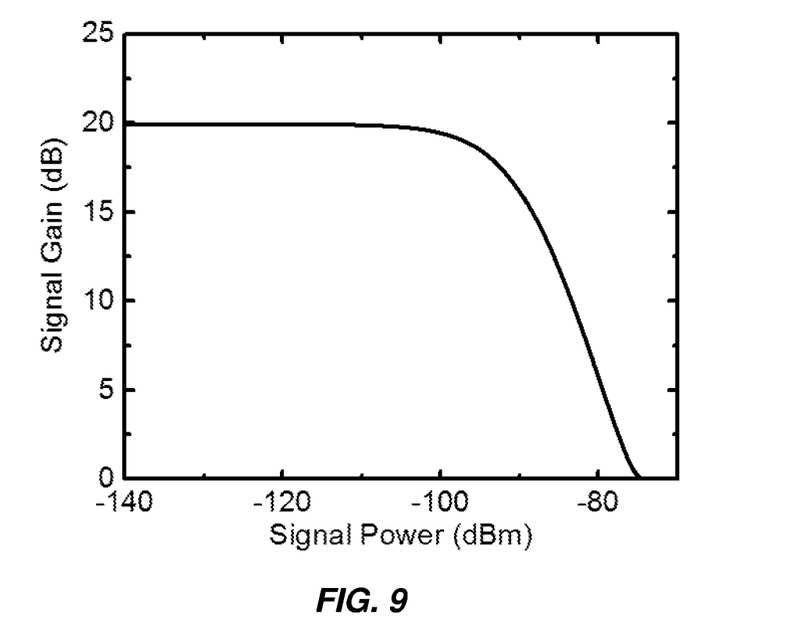
FIG. 9 is a chart illustrating signal gain in an embodiment of the disclosed TWPA as a function of signal power for $\Phi/\Phi_0=0.37$ and device length 341$a$.

The saturation power of the TWPA is limited by pump depletion effects, which generally occurs when the signal amplitude becomes comparable to the pump. This effect can be seen in FIG. 7. At such signal amplitudes the pump is depleted and the gain of the TWPA decreases. To evaluate these effects the coupled mode equations without the undepleted pump approximation and taking into account self- and cross-phase modulation are solved to determine the real amplitude and phase mismatch as a function of x along the length of the transmission line. For example, FIG. 9 shows how the signal gain decreases with signal power due to pump depletion effects with the following optimal tuning parameters: $\Phi/\Phi_0=0.37$, $\omega_p/2\pi=9$ GHz, $\omega_s/2\pi=6$ GHz, pump power −67 dBm, and a TWPA length of 341a. The signal power when the signal gain drops by 1 dB is called the 1 dB compression point or the saturation power of the amplifier which was determined to be −95 dBm.

Figure 10:
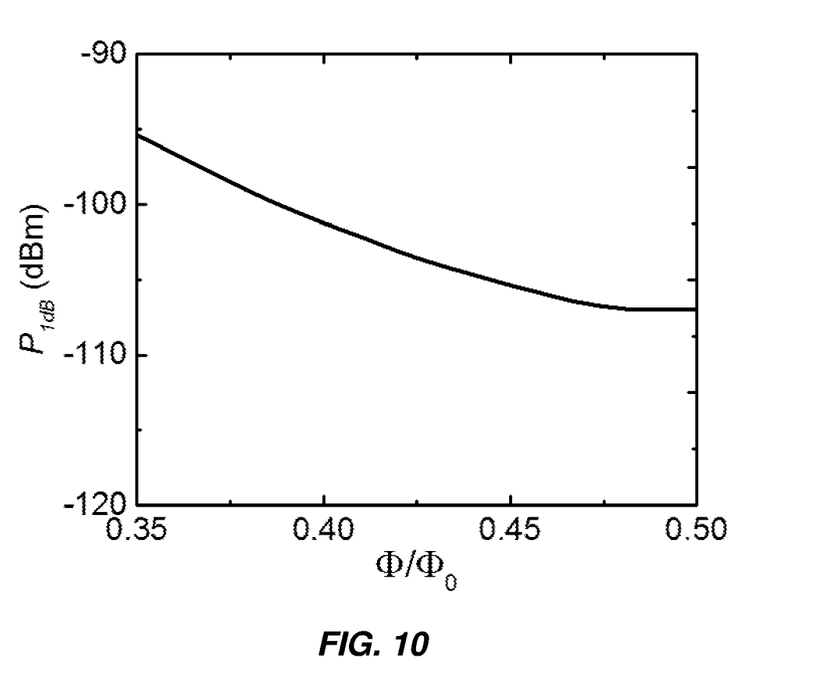
FIG. 10 is a chart illustrating simulated saturation power in an embodiment of the disclosed TWPA as a function of $\Phi/\Phi_0$.

Since the proposed TWPA is tunable with magnetic field we can evaluate at what magnetic fields gives the largest saturation power for the amplifier. The signal gain and the phase mismatch depend on magnetic flux through the self-phase modulation $\Phi_p\partial\gamma k_p^s|A_{p0}|^2$ and $k_m$. FIG. 10 shows the simulated saturation power as a function of $\Phi/\Phi_0$. For each $\Phi/\Phi_0$ the pump power is varied over the range −75 dBm ($I_{prms}\approx0.15I_{jl}$) to −67 dBm ($I_{prms}\approx0.35I_{jl}$) to maintain phase matching at $\omega_s/2\pi=6$ GHz with a $\omega_p/2\pi=9$ GHz pump. As $\Phi/\Phi_0$ varies from 0.35 to 0.5 the pump power was varied from −67 dBm to −75 dBm to maintain phase matching conditions between a signal and pump tone at signal frequencies $\omega_s/2\pi=6$ GHz and $\omega_p/2\pi=9$ GHz, respectively. Care was taken to make sure the peak pump current does not exceed $0.5I_{jl}$ where the approximation of the current phase relation of the unit cell is not exact. In these simulations the length of the TWPA was varied in order to maintain a constant signal gain of 20 dB. The simulated saturation power varies over the range −95 dBm to −106 dBm as the magnetic field is tuned between $\Phi/\Phi_0=0.35$–0.5. For $\Phi/\Phi_0<0.35$ too high a pump current $I_p<0.5I_{jl}$ is required to maintain phase matching at $\omega_s/2\pi=6$ GHz. At $\Phi/\Phi_0=0.5$ the saturation power of the TWPA will not be sensitive to flux noise to the first order.

Figure 11:
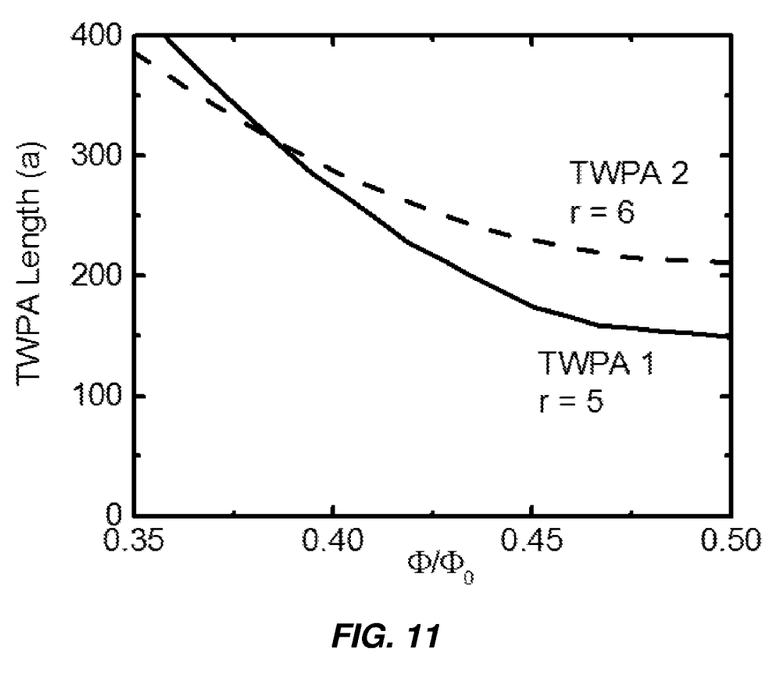
FIG. 11 is a chart illustrating simulated minimum TWPA length versus magnetic flux to maintain a signal gain of 20 dB and phase matching conditions.

For each $\Phi/\Phi_0$ in FIG. 10 the simulated length of the TWPA was varied to achieve a signal gain of 20 dB. The minimum TWPA length to achieve 20 dB gain and phase matching conditions as a function of $\Phi/\Phi_0$ is shown in FIG. 11. These simulations were done for both simulation parameters TWPA 1 (solid line) and TWPA 2 (dashed line). The simulations for both sets of parameters were done with $\omega_s/2\pi=6$ GHz and $\omega_p/2\pi=8$ GHz (9 GHz) for TWPA 1 (TWPA 2) parameters, and the pump power was varied over the same range as in FIG. 10. From these simulations a tradeoff exists between maximum saturation power and minimum TWPA length. When $\Phi_p$ and $k_m$ decrease with decreasing $\Phi/\Phi_0$ a stronger pump is required to maintain phase matching conditions which results in a larger $P_{1\,dB}$ up to −95 dBm, smaller $\gamma$, and a longer transmission line to maintain a signal gain of 20 dB. When $\Phi_p$ and $k_m$ increases with $\Phi/\Phi_0$ a smaller pump power is required to achieve phase matching, $P_{1\,dB}$ decreases, $\gamma$ increases resulting in a shorter transmission line with a minimum length of 211a for TWPA 2 parameters to achieve a signal gain of 20 dB. To show the main effect of a smaller r value on the minimum length of the TWPA, both simulation parameters TWPA 1 and TWPA 2 are shown in FIG. 11. With smaller r values a larger nonlinearity of the transmission line can be achieved which results in a shorter overall length of the TWPA 150*a* (1.5 mm) as can be seen in FIG. 11. From these simulations the effect of the saturation power on the r value was minimal.

Various embodiments described herein may be implemented, for example, in quantum information processing and superconducting quantum information sciences. For example, embodiments may be used to facilitate the parallel low-noise readout of quantum bits. A wide bandwidth quantum limited amplifier (QLA) may facilitate the multiplexed readout of many quantum bits simultaneously. Quantum computers may generally require a compact, wide bandwidth, and robust QLA. QLAs may be used in, for example, secure quantum communications, satellite-based microwave communication systems, astrophysics research (such as dark matter searches or cosmic microwave background studies), and circuit based quantum information processing. Specifically in the astronomical community, QLAs may amplify signals from microwave kinetic inductance single-photon detectors and photon number-resolving detectors in various embodiments.

In accordance with one or more embodiments, QLAs may amplify in transmission mode, have a non-reciprocal gain, a large dynamic range, and no resonant structures to limit bandwidth. The disclosed TWPA is ideally suited for low noise amplification over a wide bandwidth and large dynamic range. The amplifier is compact, robust, and ideal for ultra-secure quantum communication applications (used in quantum repeaters for long distance secure data transmission), quantum key distribution, quantum information applications (quantum bit readout electronics), long distance communications, and mixed signal applications. The disclosed QLAs and related RF elements may find applicability in a wide range of markets such as those described herein.

In at least some embodiments, a low noise two-port amplifier may have a non-reciprocal gain, for example of greater than about 20 dB, between the forward and reverse transmission from first and second ports. The amplifier may be incorporated into a measurement system which includes an amplifier cascade where the disclosed amplifier may be the first amplifier in this cascade. The disclosed amplifier may have the lowest noise (operate near the standard quantum limit) of all the amplifiers in the measurement system and be located at the mixing chamber stage of the dilution refrigerator, where a device under test is located. Since the disclosed amplifier amplifies in transmission mode, the need for additional circulators and isolators is not necessary, and thus the physical dimensions of the measurement channel may be significantly reduced since these additional RF components where in most cases several are needed consume the most space.

In accordance with one or more non-limiting embodiments, the disclosed amplifier may be characterized by a signal gain of 23 dB over a flat 3 dB bandwidth of greater than 5 GHz, and a saturation power of 98 dBm. The wide bandwidth and saturation power of the amplifier may allow for the multiplexed readout of numerous quantum circuits, a feature which is valuable in the processing of superconducting quantum information. Another feature of the disclosed amplifier is the ability of the design to produce a signal gain of 23 dB over a transmission line length of only 1.5 mm in comparison with conventional designs which require length scales of 2 cm-1 m to realize comparable gains. This advantage may facilitate lower noise operation since the finite dissipation of the transmission line is reduced due to reduced transmission line lengths.

In accordance with one or more embodiments, various parameters of the disclosed amplifier are tunable with an external magnetic flux. This feature allows for relaxed tolerance during fabrication and high yields during the manufacturing process. In some embodiments, the disclosed amplifier may allow for user tunability of the amplifier via a DC bias line which may provide an external flux biasing to the on-chip amplifier. With this tunability a user may be able to tune the tradeoff between gain and bandwidth.

In accordance with one or more embodiments, the disclosed amplifier may be provided with, for example in a kit, or otherwise used with one or more accessories. A magnetic shield for the amplifier may shield the small magnetic fields generated internal to the amplifier from interacting with the device under test. A DC power supply may apply the necessary tuning for the amplifier. The DC supply may be a user tunable low noise DC source capable of sourcing the necessary DC current to tune the amplifier. The DC source may also allow the user to save tuning settings so that different operating modes of the amplifier can be quickly recalled and enabled by the user. The DC source may allow for robust and ease of use amplifier.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A traveling wave parametric amplifier, comprising:
   an input configured to receive a weak signal and a pump signal;
   a transmission line in communication with the input and configured to transmit the weak signal and the pump signal, wherein the transmission line comprises a plurality of coupled asymmetric SQUIDs configured to amplify the weak signal to provide an amplified signal, the plurality of coupled asymmetric SQIUDS defining a ladder-like structure, and each of the plurality of coupled asymmetric SQUIDs comprising a plurality of Josephson junctions including at least one of a smaller Josephson energy junction and more than one of a larger Josephson energy junction having a higher critical current than the smaller Josephson energy junction; and
   an output from which the amplified signal exits.

2. The amplifier of claim 1, wherein adjacent coupled asymmetric SQUIDs are coupled through a larger Josephson energy junction.

3. The amplifier of claim 2, wherein the larger Josephson energy junctions of adjacent coupled asymmetric SQUIDs form a serpentine path.

4. The amplifier of claim 1, wherein each of the larger Josephson energy junctions has a Josephson energy in the range 10 to 20 Kelvin and a charging energy in the range 0.1 to 0.2 Kelvin.

5. The amplifier of claim 4, wherein by adjusting the ratio of the Josephson energy of the large junction to that of the small junction, the inductance and its non-linearity can be tuned.

6. The amplifier of claim 1, wherein the critical current of the smaller Josephson energy junctions is in the range 0.5 µA to 2 µA.

7. The amplifier of claim 6, wherein the critical current of the larger Josephson energy junctions is in the range 2 µA to 8 µA.

8. The amplifier of claim 4, wherein by adjusting a magnetic flux in situ tuning of an inductance of the amplifier and its non-linearity can be utilized to realize phase matching conditions in a degenerate four-wave mixing process.

9. The amplifier of claim 1, wherein the plurality of coupled asymmetric SQUIDs is configured to allow for a mixing process to occur between the weak signal, generated idler and the pump signal traveling along the transmission line, resulting in a parametric gain of the weak signal.

10. The amplifier of claim 1, further configured to amplify only in a forward direction.

11. The amplifier of claim 1, further configured to amplify in a transmission mode.

12. The amplifier of claim 1, further configured to provide an exponential gain of the weak signal as a function of device length.

13. The amplifier of claim 1, further configured to have a bandwidth of about 1 GHz to about 6 GHz.

14. The amplifier of claim 1, further configured to have a gain of 20 dB or greater.

15. The amplifier of claim 1, further configured to have a saturation power of −95 dBm or greater.

16. An integrated circuit comprising the traveling wave parametric amplifier set forth in claim 1 and a device under test.

* * * * *